United States Patent [19]

Fischer et al.

[11] 3,787,717

[45] Jan. 22, 1974

[54] OVER VOLTAGE PROTECTION CIRCUIT LATERAL BIPOLAR TRANSISTOR WITH GATED COLLECTOR JUNCTION

[75] Inventors: Walter Fischer, Herrenberg-Affstaett, Germany; Aldo Josef Mastai, Zuerich, Switzerland; Edouard Yves Rocher, Ossining, N.Y.

[73] Assignee: International Business Machines Corporation, Armonk, N.Y.

[22] Filed: Dec. 9, 1971

[21] Appl. No.: 206,361

[52] U.S. Cl. .............. 317/235 R, 307/303, 307/304, 317/235 B, 317/235 G, 317/235 Y, 317/235 AH, 317/235 AE, 307/202

[51] Int. Cl. .............. H01l 19/00

[58] Field of Search ...... 317/235 G, 235 Y, 235 AH

[56] References Cited

UNITED STATES PATENTS

| | | | |
|---|---|---|---|
| 3,739,238 | 6/1973 | Hara | 317/235 G |
| 3,639,787 | 2/1972 | Lee | 307/303 |
| 3,622,812 | 11/1971 | Crawford | 307/303 |
| 3,403,270 | 9/1968 | Pace et al. | 317/235 G |

OTHER PUBLICATIONS

Gladu, IBM Tech. Discl. Bull., Vol. 13, No. 2, July 1970, p. 315, "Use of Lateral NPN Devices for Interfacing FET Circuits."

Lenzlinger, "Gate Protection of MIS Devices", IEEE Trans. Elect. Dev., Vol. ED18, No. 4, pp. 249–257 (Apr. 1971) (L7140 0105)

*Primary Examiner*—Rudolph V. Rolinec
*Assistant Examiner*—William D. Larkins
*Attorney, Agent, or Firm*—Robert J. Haase

[57] ABSTRACT

An over voltage protection circuit, especially adapted for the protection of field effect transistor gate dielectric material and other circuit structures against high voltage, high peak current, short duration impulses such as produced by static electricity. The gate of the protected FET is shunted to ground by a lateral bipolar transistor whose collector junction is passivated by a layer of silicon dioxide thinner than the passivation layer at other locations. The silicon dioxide layer is covered by a metallization layer which extends from above the collector junction and makes contact to the emitter and to the substrate. The substrate contact is connected to a source of fixed potential. The collector is connected to the gate of the protected FET.

3 Claims, 3 Drawing Figures

INVENTORS
WALTER FISCHER
ALDO J. MASTAI
EDOUARD Y. ROCHER

BY Robert J. Haase
ATTORNEY

OVER VOLTAGE PROTECTION CIRCUIT LATERAL BIPOLAR TRANSISTOR WITH GATED COLLECTOR JUNCTION

BACKGROUND OF THE INVENTION

As is well known, the gate dielectric material of insulated gate field effect transistors is vulnerable to breakdown during fabrication handling due to inadvertent application of high voltage impulses of static electricity. Many FET over voltage protection techniques have been proposed but these have not been fully satisfactory. The desired over voltage protection circuit is one which can be fabricated on the same monolithic chip along with the FET devices to be protected without introducing process steps which are extraneous to or incompatible with the process for making the protected FET devices. Additionally, the over voltage protection circuit should not load the protected FETs during normal operation and should react extremely fast to divert over voltage surges safely away before the protected FETs suffer dielectric breakdown. Thus, the over voltage protection device preferably should be realizable using FET fabrication processes and should exhibit a gain characteristic in order to respond in minimum time to an over voltage condition.

SUMMARY OF THE INVENTION

An over voltage protection circuit comprising a lateral bipolar transistor equipped with a gated collector junction. The collector-to-emitter circuit of the lateral transistor shunts the circuit point which is to be protected against over voltages. The collector junction is gated by placing metallization over a passivation layer (silicon dioxide) covering the collector junction and by connecting the metallization to a substrate point held at a fixed potential. The emitter likewise is connected to said point. Upon the occurrence of an over voltage, the gated collector junction of the lateral transistor avalanches and permits current to flow from the collector junction to said substrate point via the semiconductor substrate. The avalanche breakdown point may be reduced by selectively decreasing the thickness of the passivation layer over the collector junction.

Said current flow causes a potential drop in the base region of the lateral transistor adjacent the emitter of the lateral transistor. A portion of said potential drop is impressed across the emitter-base junction of the lateral transistor via the emitter contact to forward bias the emitter junction and initiate low impedance conduction in the lateral transistor. Upon the conduction of the lateral transistor, the over voltage surge is rapidly and safely diverted away from the protected circuit point. The process for fabricating the lateral transistor is fully compatible with conventional insulated gate field effect transistor processes.

DESCRIPTION OF THE PREFERRED EMBODIMENT

Figure 1:
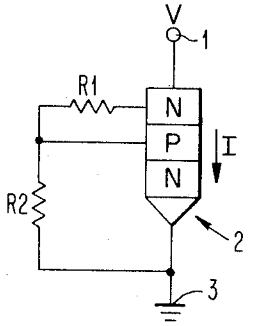
FIG. 1 is a simplified equivalent circuit representing the over voltage protection device of the present invention.

Referring to FIG. 1, circuit point 1 is to be protected against over voltages by NPN transistor 2 which is connected between point 1 and ground 3. Transistor 2 preferably is formed on the same monolithic semiconductor chip with other circuit devices (not shown) to be protected and which receive input signals via circuit point 1. The resistance through the semiconductor bulk material in the base region of transistor 2 is represented by resistors $R_1$ and $R_2$. More particularly, resistor $R_1$ extends from the collector junction of transistor 2 through the depletion region associated therewith when the collector junction is back-biased. Resistor $R_2$ extends from the edge of said depletion region to grounded contact 3.

Negative voltages applied to terminal 1 forward bias the collector junction and are shunted through $R_2$ to ground. Transistor 2 is non-conductive upon the applications of positive voltages between terminal 1 and ground 3 which are insufficient to cause avalanche breakdown of the collector junction. However, when the applied voltage exceeds the avalanche breakdown point, current flows through resistors $R_1$ and $R_2$ to ground. The voltage drop produced across resistor $R_2$ forward biases the emitter junction of transistor 2 and initiates rapid and full conduction through the low impedance of the conducting transistor. Damaging currents (up to the order of one ampere peak value) due to over voltage are diverted directly to ground and safely away from the protected circuits which receive input signals from circuit point 1. In accordance with the present invention, the over voltage protection circuit is fabricated by the same conventional processes used for making insulated gate field effect transistors. The gate dielectric material of an insulated gate field effect transistor is a typical example of a circuit structure to be protected against over voltages.

Figure 2:
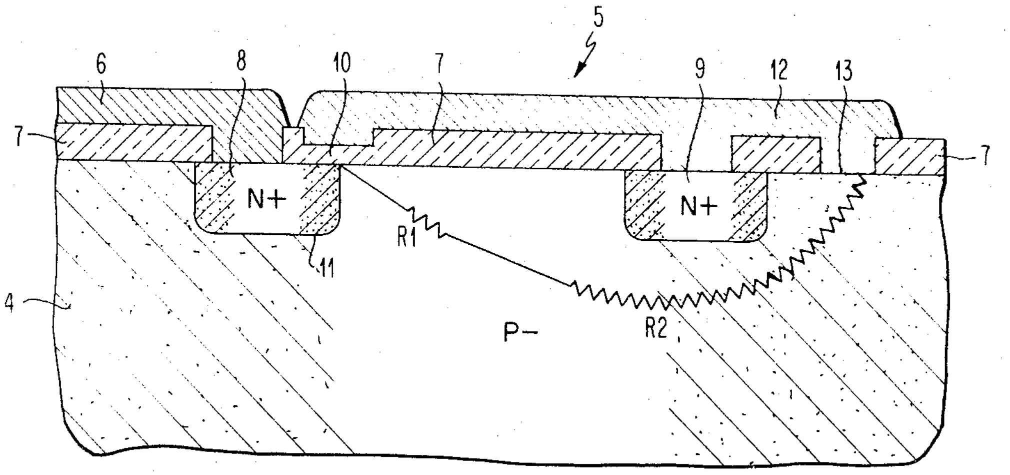
FIG. 2 is a simplified cross-sectional view of a preferred lateral transistor embodiment of the present invention.

The lateral bipolar transistor of a preferred embodiment of the present invention is shown in the cross sectional view of FIG. 2. Semiconductor substrate 4 is commonly shared by the lateral transistor 5 and by field effect transistors (not shown) whose gates are connected to input metallization 6 which may receive inadvertent over voltages from time to time. Assuming, for example, that the protected FETs are N channel, substrate 4 is of P- conductivity type which is covered by a silicon dioxide masking layer 7. Masking layer 7 is etched by a conventional photolithographic process to form diffusion windows for making N+ diffusions 8 and 9 of transistor 5 simultaneously with the source and drain diffusions of the protected FETs. Diffusions 8 and 9 correspond, respectively, to the collector and emitter diffusions of lateral transistor 5. Following the diffusion step, the masking oxide is removed from the channel areas of the protected FETs and from the region 10 adjacent a portion of the collector junction 11. Relatively thin oxide then is simultaneously grown over the exposed surface portions (FET channel areas and region 10) of substrate 4 and metallization is selectively placed over the resulting oxide layers. Metallization 6 contacts the collector 8 of lateral transistor 5 and extends to the input terminal (not shown) which is to be protected against over voltages. Metallization 12 extends from the thin oxide at region 10, continues over the thicker oxide 7 and makes contact to emitter 9 and to substrate 4 at point 13. Point 13 is connected to a source of fixed potential (not shown).

The process steps for making lateral transistor 5 and the N channel FETs to be protected have only been briefly outlined inasmuch as they are well understood by those skilled in the art. Typical process steps are described in more detail, for example, in Characteristics and Operation of MOS Field-Effect Devices by Paul Richmond, McGraw-Hill, 1967, pages 87–89. It will be noted that the two different oxide thicknesses at regions 10 and 7 do not require the introduction of steps not already in the standard FET process cited above. The thick oxide 7 is formed during the masking oxide step of the FET process. The thin oxide at region 10 is formed during the gate oxide regrowth step of the FET process. Similarly, the collector and emitter diffusions 11 and 9 are made simultaneously with the source and drain diffusions of the FET process.

Figure 3:
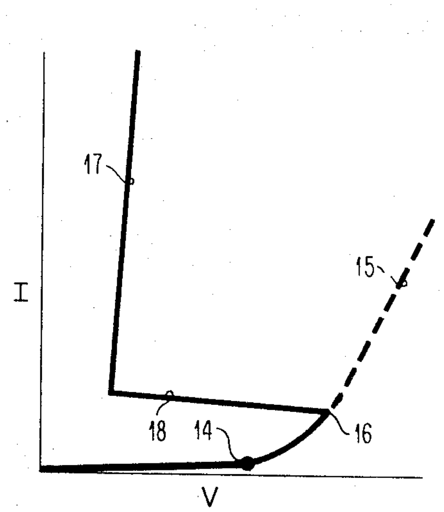
FIG. 3 is an idealized plot of the current-voltage characteristic of the device of FIG. 2.

The operation of the lateral transistor 5 under over voltage conditions can be understood with the aid of FIG. 3. FIG. 3 is a plot of the current flowing between the input metallurgy 6 of lateral NPN transistor 5 and substrate point 13 as the voltage applied to metallurgy 6 increases from zero in a positive direction. Initially, a negligibly small current flows until the applied voltage reaches region 14 on the plot of FIG. 3 at which the collector junction 11 begins to undergo avalanche breakdown. The avalanche breakdown voltage is lowered by the presence of the field relief electrode 12 which overlies the relatively thin oxide at region 10 above a portion of the collector junction 11 and is a function of the thickness of the oxide layer in region 10. When said thickness is made equal to the thickness of the gate dielectric overlying the channel region of the protected FET in accordance with the present invention the junction 11 of the lateral transistor 5 reaches the avalanche breakdown point substantially below the voltage level causing the breakdown of the gate dielectric of the protected FET.

As the reverse potential across junction 11 increases, the depletion region and the number of thermally generated free electrons associated therewith also increase. The free electrons are swept across the depletion region and through the substrate resistance represented by $R_2$ toward contact point 13. As this leakage current increases, a point is reached where the voltage drop across the equivalent resistor $R_2$ reaches a potential sufficient to forward bias the junction of emitter 9 to initiate bipolar action. Consequently, the increasing current no longer follows the leakage current curve 15 but rather abruptly departs therefrom at point 16 (at which bipolar transistor action is initiated) and continues along the bipolar transistor characteristic 17. It will be noted that there is a sharp reduction in voltage concurrently with the initiation of transistor action despite the substantial increase of current. Reduced voltages are maintained along the entire lateral NPN transistor characteristic 18.

Lateral transistor action is achieved simply by placing the diffusions 8 and 9 in proximity to each other in accordance with well known design considerations to cause bipolar transistor action. Diffusions similar to diffusions 8 and 9 which are simultaneously made for the protected FETs (not shown) are spaced apart beyond the distance at which bipolar transistor operation is possible.

The effective beta of the lateral NPN transistor is a function of the spacing of diffusions 8 and 9. Optimized spacing for high beta, however, must also take into account possible surface leakage between diffusions 8 and 9 (acting as the drain and source, respectively, of a grounded gate FET having no substrate bias) during the time when over voltage conditions are not present. Surface leakage is reduced by the step increase in thickness of oxide 7 between region 10 and diffusion 9 and by increasing the spacing between diffusions 8 and 9. The latter design factor affects beta and device response time inversely as it does leakage. Accordingly, compromise must be made so that the spacing between diffusions 8 and 9 is sufficiently small to allow substantial beta (as manifested by the marked departure of 17 from 15 in the I-V curve of FIG. 3) and short enough response time while still permitting tolerably small leakage (as manifested by the portion of the I-V curve of FIG. 3 before point 14 is reached).

While this invention has been particularly described with reference to the preferred embodiments thereof, it will be understood by those skilled in the art that the foregoing and other changes in form and details may be made therein without departing from the spirit and scope of the invention.

What is claimed is:

1. An over voltage protection circuit connected between a point of fixed potential and a circuit point to be protected against voltage increases beyond a predetermined value with respect to said fixed potential, said protection circuit comprising:

a laterial junction bipolar transistor having collector and emitter areas separated by a base area which is part of a semiconductor substrate in which said transistor is formed, the collector junction and said base area of said transistor being covered by an insulating layer, said insulating layer being of reduced thickness over said collector junction relative to the thickness of said insulating layer over said base area other than at said collector junction, said collector and emitter areas being spaced apart by said base area, whereby bipolar transistor action occurs when said collector junction is back biased and the emitter junction of said transistor is forward biased, a first conductive member over said insulating layer at the location of said collector junction, said first conductive member making electrical contact to said emitter area, said substrate and said point of fixed potential, and a second conductive member making electrical contact to said circuit point to be protected and to said collector region of said transistor.

2. The over voltage protection circuit defined in claim 1 wherein said circuit point to be protected is on said substrate.

3. The over voltage protection circuit defined in claim 1 wherein said circuit point to be protected is spaced from said substrate by an insulating layer having said reduced thickness.

* * * * *